(12) United States Patent
Mihnea et al.

(10) Patent No.: US 8,542,542 B2
(45) Date of Patent: Sep. 24, 2013

(54) NON-VOLATILE MEMORY CELL HEALING

(75) Inventors: Andrei Mihnea, Boise, ID (US); William Kueber, Boise, ID (US); Mark Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/567,729

(22) Filed: Aug. 6, 2012

(65) Prior Publication Data

US 2012/0300551 A1 Nov. 29, 2012

Related U.S. Application Data

(62) Division of application No. 12/721,165, filed on Mar. 10, 2010, now Pat. No. 8,238,170, which is a division of application No. 11/809,180, filed on May 31, 2007, now Pat. No. 7,701,780.

(51) Int. Cl.
*G11C 11/34* (2006.01)

(52) U.S. Cl.
USPC ............. 365/185.3; 365/185.23; 365/185.26; 365/185.28; 365/185.33

(58) Field of Classification Search
USPC ............... 365/185.3, 185.23, 185.26, 185.28, 365/185.33
See application file for complete search history.

(56) References Cited

U.S. PATENT DOCUMENTS

| | | | |
|---|---|---|---|
| 5,095,344 A | 3/1992 | Harari | |
| 5,122,985 A | 6/1992 | Santin | |
| 5,163,021 A | 11/1992 | Mehrotra et al. | |
| 5,172,338 A | 12/1992 | Mehrotra et al. | |
| 5,237,535 A | 8/1993 | Mielke et al. | |
| 5,359,558 A | 10/1994 | Chang et al. | |
| 5,619,454 A | 4/1997 | Lee et al. | |
| 5,732,019 A | 3/1998 | Urai | |
| 6,115,291 A | 9/2000 | Lakhani | |
| 6,288,944 B1 | 9/2001 | Kawamura | |
| 6,493,280 B2 | 12/2002 | Mihnea et al. | |
| 6,798,699 B2 | 9/2004 | Mihnea et al. | |
| 7,099,220 B2 | 8/2006 | Mihnea et al. | |
| 7,283,397 B2 | 10/2007 | Harari et al. | |
| 2002/0121653 A1* | 9/2002 | Mihnea et al. | 257/261 |
| 2004/0153817 A1 | 8/2004 | Norman et al. | |
| 2005/0122779 A1 | 6/2005 | Fasoli et al. | |
| 2005/0172065 A1 | 8/2005 | Keays | |
| 2005/0265097 A1* | 12/2005 | Tanaka et al. | 365/203 |
| 2005/0270835 A1* | 12/2005 | Chevallier | 365/185.03 |
| 2006/0033215 A1 | 2/2006 | Blanchet et al. | |
| 2006/0106972 A1 | 5/2006 | Gorobets et al. | |
| 2006/0221705 A1* | 10/2006 | Hemink et al. | 365/185.28 |
| 2006/0278913 A1 | 12/2006 | Mihnea et al. | |
| 2008/0049512 A1* | 2/2008 | Seidel et al. | 365/185.22 |

* cited by examiner

*Primary Examiner* — Fernando Hidalgo
(74) *Attorney, Agent, or Firm* — Brooks, Cameron & Huebsch PLLC

(57) ABSTRACT

Embodiments of the present disclosure provide methods, devices, modules, and systems for healing non-volatile memory cells. One method includes biasing a first select gate transistor coupled to a string of memory cells at a first voltage, biasing a second select gate transistor coupled to the string at a second voltage, applying a first healing voltage to a first edge word line in order to extract charge accumulated between the first select gate transistor and a first edge memory cell stack of the string, and applying a second healing voltage to a second edge word line in order to extract charge accumulated between the second select gate transistor and a second edge memory cell stack of the string.

21 Claims, 6 Drawing Sheets

| | | HEAL | ERASE | ERASE VERIFY | PROGRAM (WL-1) | READ (WL-1 READ) |
|---|---|---|---|---|---|---|
| | BL | 0 V | FLOATING | 1.0 V | 0 V/Vcc | 1.0 V |
| | SGD | 0 V | FLOATING | 4.5 V | Vcc→1.0 V | (4.5 V) Vpass_read |
| | WL-31 | Vheal | 0 V | 0 V | Vpass (10 V) | 4.5 V |
| | WL-30 | Vheal | 0 V | 0 V | Vpass | 4.5 V |
| | WL-29 | Vheal | 0 V | 0 V | Vpass | 4.5 V |
| | WL-1 | Vheal | 0 V | 0 V | Vpgm | Vread |
| | WL-0 | Vheal | 0 V | 0 V | Vpass | 4.5 V |
| | SGS | 0 V | FLOATING | 4.5 V | 0 V | 4.5 V |
| | SOURCE | 0 V | FLOATING | 0 V | Vcc | 0 V |
| | P-well (+N-well) | 0 V | Vera=20 V | 0 V | 0 V | 0 V |

*Fig. 4*

| | HEAL-1 | HEAL-2 | HEAL-3 |
|---|---|---|---|
| BL | 0 V | 0 V | 0 V |
| SGD | 0 V | 0 V | 0 V |
| WL-31 | 20 V | 20 V | 20 V |
| WL-30 | 20 V | 15 V | 18 V |
| WL-29 | 20 V | 15 V | 16 V |
| ⋮ | | | |
| WL-2 | 20 V | 15 V | 16 V |
| WL-1 | 20 V | 15 V | 18 V |
| WL-0 | 20 V | 20 V | 20 V |
| SGS | 0 V | 0 V | 0 V |
| SOURCE | 0 V | 0 V | 0 V |
| P-well (+N-well) | 0 V | 0 V | 0 V |

*Fig. 5*

NON-VOLATILE MEMORY CELL HEALING

This application is a Divisional of U.S. application Ser. No. 12/721,165, filed Mar. 10, 2010, issued as U.S. Pat. No. 8,238,170 which is a Divisional of U.S. application Ser. No. 11/809,180, filed May 31, 2007, issued as U.S. Pat. No. 7,701,780, the specifications of which are incorporated herein by reference.

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

Two common types of flash memory array architectures are the "NAND" and "NOR" architectures, so called for the logical form in which the basic memory cell configuration of each is arranged.

A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on, or removed from, the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

MLC memory stores multiple bits on each cell by using different threshold voltage (Vt) levels for each state that is stored. The difference between adjacent Vt distributions may be very small for a MLC memory device as compared to a SLC memory device. The reduced margins between adjacent Vt distributions, e.g., program states, can increase the difficulty associated with distinguishing between adjacent program states, which can lead to problems such as reduced data read and/or data retrieval reliability.

Various degradation mechanisms exist which can result in erroneous data reads of non-volatile memory cells. In a NAND array architecture, the state of a selected memory cell can be determined by sensing a current or voltage variation associated with a particular bit line to which the selected cell is coupled. Since the memory cells are connected in series, the current associated with reading the selected cell passes through several other unselected cells, e.g., cells biased so as to be in a conductive state, coupled to the bit line.

The cell current associated with a string of memory cells, e.g., cells coupled in series between a source line and a bit line, can become degraded over time due to factors such as program/erase cycling. Memory cells affected by current degradation mechanisms can become unreliable, e.g., the logical value read from the cells may not necessarily be the logical value written to the cells.

BRIEF DESCRIPTION OF THE DRAWINGS

FIG. 4 illustrates a table of operating voltages that can be used in accordance with embodiments of the present disclosure.

FIG. 5 illustrates another table of operating voltages that can be used in accordance with embodiments of the present disclosure.

DETAILED DESCRIPTION

Embodiments of the present disclosure provide methods, devices, modules, and systems for healing non-volatile memory cells. One method includes biasing a first select gate transistor coupled to a string of memory cells at a first voltage, biasing a second select gate transistor coupled to the string at a second voltage, applying a first healing voltage to a first edge word line in order to extract charge accumulated between the first select gate transistor and a first edge memory cell stack of the string, and applying a second healing voltage to a second edge word line in order to extract charge accumulated between the second select gate transistor and a second edge memory cell stack of the string.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

Figure 1:
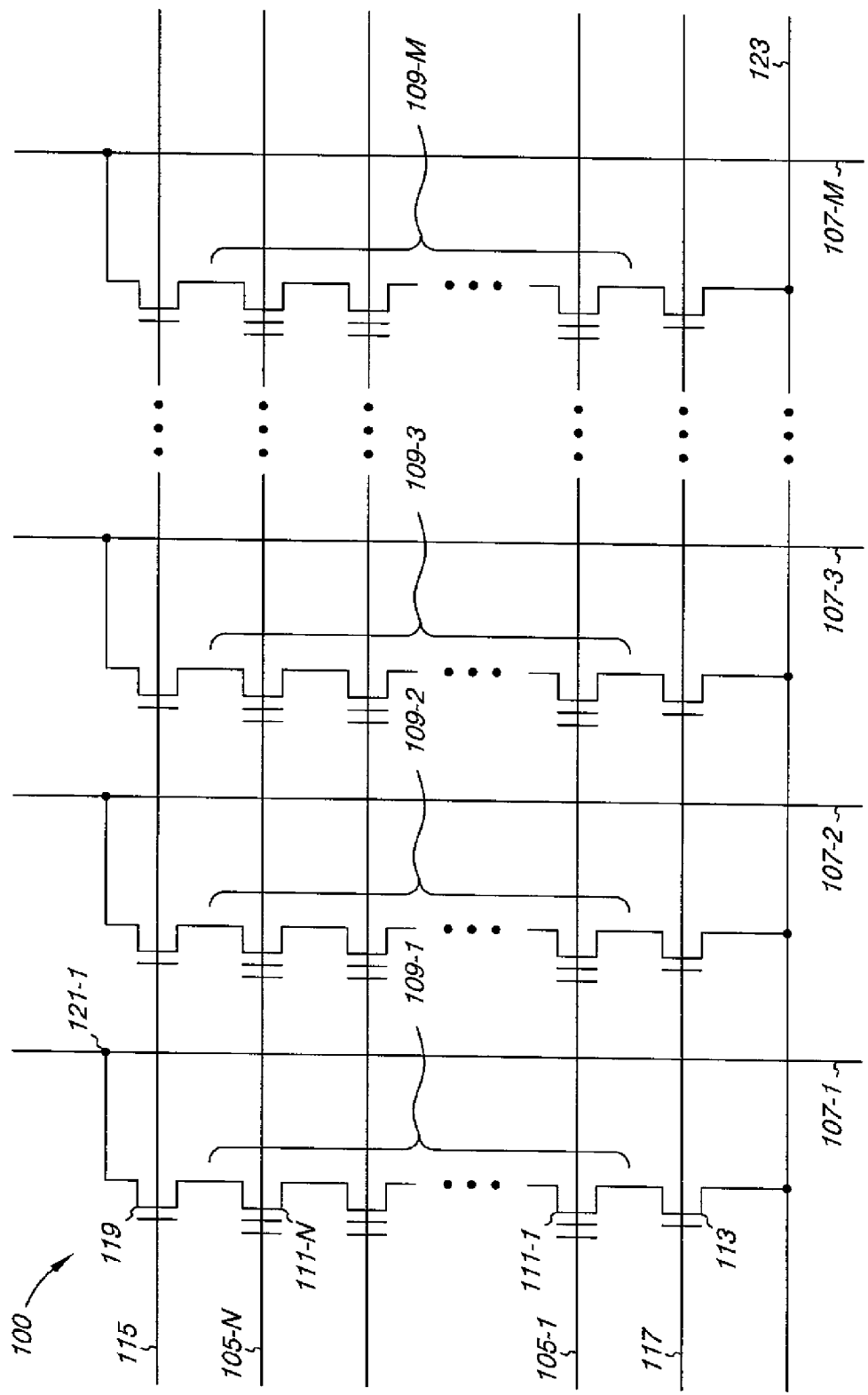
FIG. 1 is a schematic of a portion of a non-volatile memory array that can be used with embodiments of the present disclosure.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. In various embodiments, the array 100 includes at least some multilevel memory cells (MLCs).

As shown in FIG. 1, the memory array 100 includes word lines 105-1, ..., 105-N and intersecting bit lines 107-1, ..., 107-M. For ease of addressing in the digital environment, the number of word lines 105-1, ..., 105-N and the number of bit lines 107-1, ..., 107-M are each some power of two, e.g., 256 word lines by 4,096 bit lines. The indicators "M" and "N" are used to indicate that the array 100 can include a number of word lines and a number of bit lines.

Memory array 100 includes NAND strings 109-1, ..., 109-M. Each NAND string includes non-volatile memory cells 111-1, ..., 111-N, each located at an intersection of a word line 105-1, ..., 105-N and a local bit line 107-1, ..., 107-M. The non-volatile memory cells 111-1, ..., 111-N of each NAND string 109-1, ..., 109-M are connected in series source to drain between a select gate source (SGS) transistor, e.g., a field-effect transistor (FET) 113, and a select gate drain (SGD) transistor, e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells 111-1, ..., 111-N includes a source, a drain, a floating gate or charge storage layer, and a control gate. Non-volatile memory cells, 111-1, ..., 111-N, have their control gates coupled to a word line, 105-1, ..., 105-N, respectively. A column of the non-volatile memory cells 111-1, ..., 111-N make up the NAND strings, e.g., 109-1, ..., 109-M, coupled to a given local bit line, e.g., 107-1, ..., 107-M, respectively. A row of the non-volatile memory cells are commonly coupled to a given word line, e.g., 105-1, ..., 105-N. An AND array architecture would be similarly laid out except that the string of memory cells would be coupled in parallel between the select gates.

As will be described further below in connection with FIGS. 3A, 3B, 4, and 5, various embodiments of the present disclosure can be used to counteract current degradation associated with operating an array of non-volatile memory cells, e.g., array 100. For example, a healing operation in accordance with embodiments of the present disclosure can be performed on one or more strings of memory cells, e.g., 109-1, ..., 109-M. In such embodiments, the healing operation can be used to extract charge, e.g., trapped electrons, located between adjacent floating gates of a string and/or located between a select gate, e.g., 113/119, and the floating gate of an edge cell of the string. As used herein, an edge cell refers to a memory cell adjacent to a select gate, e.g., memory cell 111-1 of FIG. 1 is an edge cell adjacent to select gate 113 and memory cell 111-N is an edge cell adjacent to select gate 119.

Figure 2:
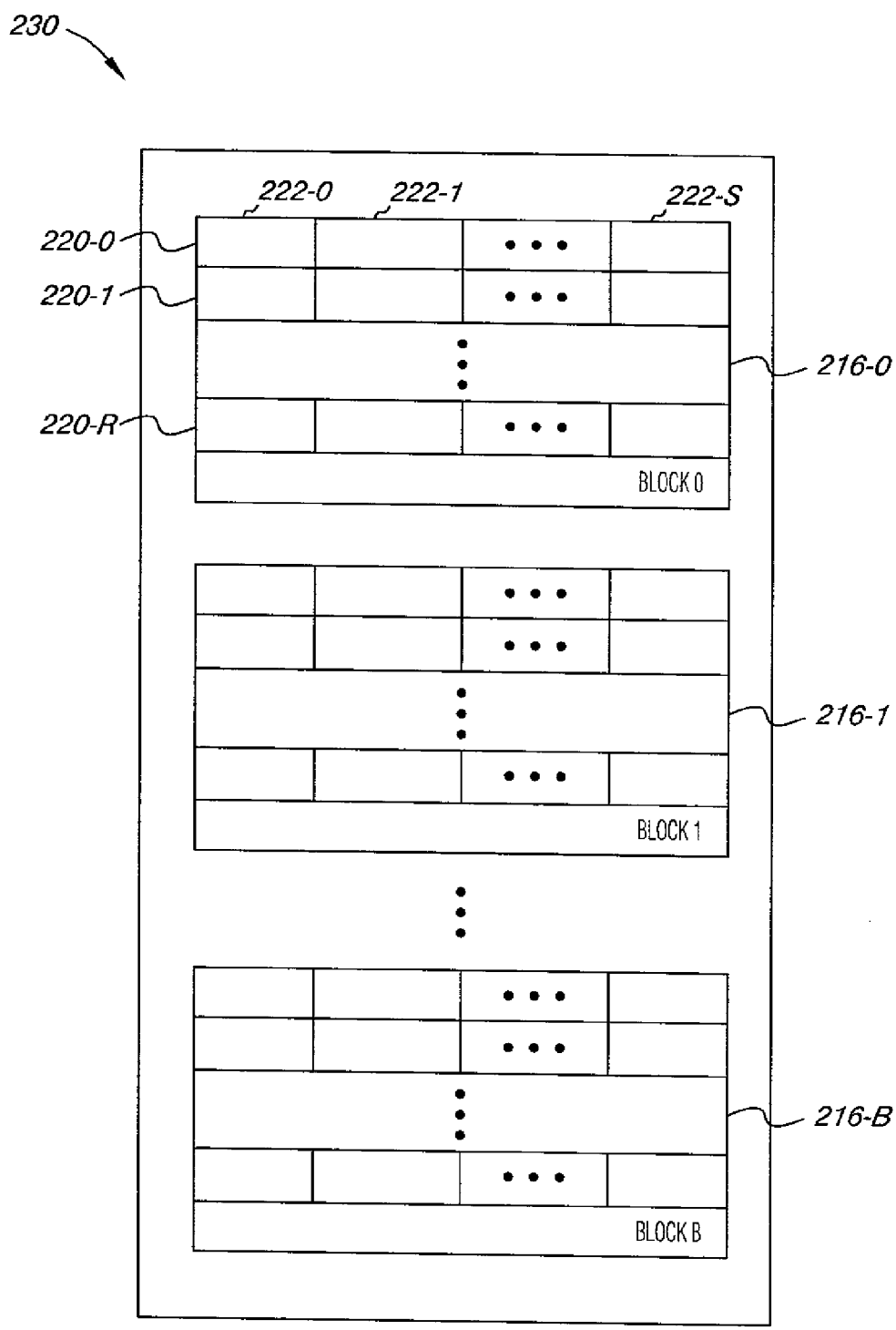
FIG. 2 illustrates a diagram of a memory array having a number of blocks that can be used with embodiments of the present disclosure.

FIG. 2 illustrates a diagram of a memory array 230 having a number of blocks 216-0 (BLOCK 0), 216-1 (BLOCK 1), ..., 216-B (BLOCK B) that can be used with embodiments of the present disclosure. As an example, the number of memory blocks in array 230 may be 128 blocks, 512 blocks, or 1,024 blocks, but embodiments are not limited to a particular number of memory blocks in an array 230. In the embodiment illustrated in FIG. 2, the memory array 230 is a NAND flash memory array 230.

In various embodiments, the blocks 216-0 to 216-B can be referred to as erase blocks. In such embodiments, the memory cells in each block 216-0 to 216-B can be erased together as a unit, e.g., the cells in each block can be simultaneously erased. Each memory block, e.g., 216-0 to 216-B, contains a number of physical rows 220-0, 220-1, ..., 220-R of memory cells coupled to a word line. In some embodiments, the number of rows, e.g., word lines, in each memory block can be 32, but embodiments are not limited to a particular number of rows 220-0 to 220-R, e.g., word lines, per block.

In various embodiments of the present disclosure, a healing operation can be performed on a block by block basis. As described below, in some embodiments, a healing operation can be performed prior to each of a number of erase operations performed on a block, e.g., 216-0 to 216-B. In some embodiments, a healing operation can be performed in response to an erase verify operation failure associated with a block, e.g., 216-0 to 216-B.

In some embodiments, a healing operation can be performed on a block, e.g., 216-0 to 216-B based on a wear level algorithm associated with the array, e.g., array 230. As an example, the healing operation can be performed on the block based on a number of program and/or erase cycles associated with the block. For instance, the healing operation can be performed on the block in response to the block experiencing a threshold number of erase cycles, e.g., 500, 1,000, or 5,000 cycles. The number of program and/or erase cycles associated with a block can be referred to as a "hot count."

In various embodiments, a healing operation can be simultaneously performed on multiple blocks. For example, in some embodiments, one or more blocks may be set aside, e.g., not further programmed and/or read from, once the block reaches a threshold hot count. In such cases, a healing operation in accordance with various embodiments of the present disclosure, can be simultaneously performed on a group of blocks which have reached the threshold hot count. Healing a number of blocks together can provide benefits such as reducing the time associated with healing the blocks as compared to healing blocks on a block by block basis.

As one of ordinary skill in the art will appreciate, each row 220-0 to 220-R can store one or more pages of data. A page can refer to a unit of programming and/or reading, e.g., a number of cells that are programmed and/or read in parallel. In the embodiment shown in FIG. 2, each row 220-0 to 220-R stores one page of data. However, embodiments are not so limited. For instance, in some embodiments, each row can store multiple pages of data. In some embodiments, each row can store one or more even pages of data associated with even bit lines and one or more odd pages of data associated with odd bit lines. In various embodiments, and as shown in FIG. 2, a page associated with the rows 220-0 to 220-R can store a number of logical sectors 222-0, 222-1, . . . , 222-S of data. Each logical sector 222-0 to 222-S can store a number of bytes of data, e.g., 256 bytes, 512 bytes, or 1,024 bytes, but embodiments are not limited to a particular number of bytes of data stored in a logical sector 222-0 to 222-S. It is noted that other formats and/or configurations for the blocks 216-0 to 216-B, rows 220-0 to 220-R, sectors 222-0 to 222-S, and pages are possible. For example, the rows 220-0 to 220-R of the memory blocks 216-0 to 216-B can include a single sector which can include more or less than 512 bytes of data.

Figure 3A:
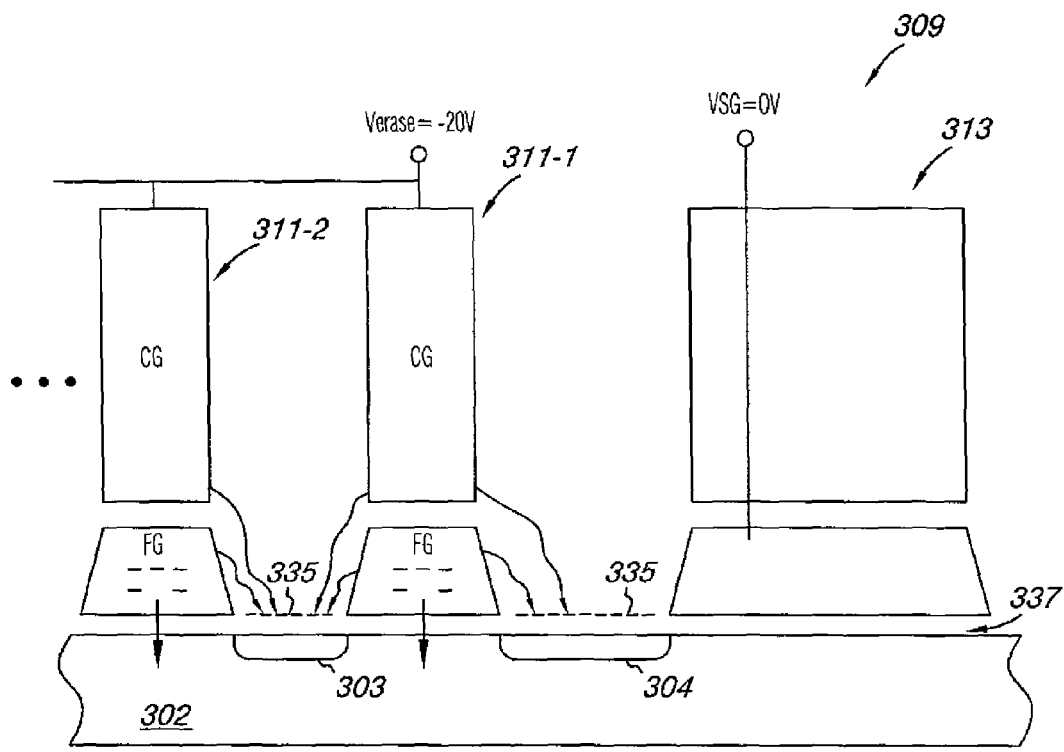
FIG. 3A illustrates a cross-sectional diagram of a portion of a string of non-volatile memory cells during an erase operation.
Figure 3B:
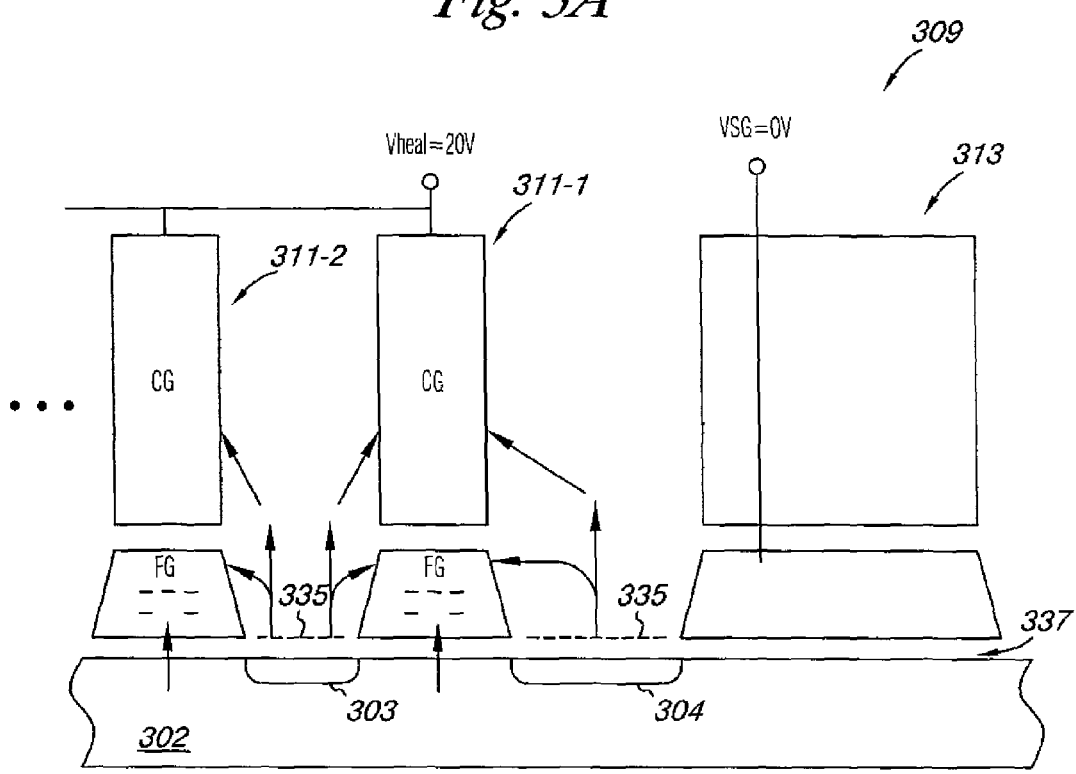
FIG. 3B illustrates a cross-sectional diagram of the portion of the string of non-volatile memory cells shown in FIG. 3A during a healing operation according to an embodiment of the present disclosure.

FIG. 3A illustrates a cross-sectional diagram of a portion of a string 309, e.g., string 109-1 to 109-M shown in FIG. 1, of non-volatile memory cells during an erase operation. FIG. 3B illustrates a cross-sectional diagram of the portion of the string 309 shown in FIG. 3A during a healing operation according to an embodiment of the present disclosure.

In the diagrams illustrated in FIGS. 3A and 3B, the string 309 is a NAND string 309 that includes a number of memory cells 311-1/311-2 and a select gate transistor 313. In this embodiment, the memory cell 311-1 is an edge memory cell and the memory cell 311-2 is a non-edge memory cell, e.g., a cell which is not adjacent to a select gate transistor associated with the string. In this embodiment, the select gate transistor 313 is a source select gate transistor 313, e.g., a select gate transistor which couples the string 309 to a common source line, e.g., source line 123 shown in FIG. 1.

As shown in the diagrams illustrated in FIGS. 3A and 3B, the memory cells 311-1/311-2 have a gate stack configuration including a control gate (CG) and a floating gate (FG) formed over a substrate 302. In the embodiment illustrated in FIGS. 3A and 3B, the substrate 302 is a p-type silicon substrate 302 implanted with n-type diffusion regions 303 and 304 that act as the source/drain regions for the memory cells 311-1/311-2. The substrate 302 can be referred to as the substrate body region, e.g., P-well region in this example. In various embodiments, the n-type diffusion regions 303 and 304 are lightly doped n-type, e.g., n-, diffusion regions. In some embodiments, the substrate 302 can be an n-type substrate implanted with p-type diffusion regions 303 and 304 such that the substrate body is an N-well region.

As shown in the diagrams illustrated in FIGS. 3A and 3B, a dielectric layer 337 is formed on the substrate 302. The floating gates of memory cells 311-1/311-2 can be formed over the dielectric layer 337. The dielectric layer 337 is also located between adjacent memory cell gate stacks 311-1/311-2 and between the edge cell 311-1 and the select gate 313 above at least a portion of the diffusion regions 303 and 304. The dielectric layer 337 can be silicon dioxide or another dielectric material. In various embodiments, the dielectric layer 337 can include a number of layers of the same or different dielectric material(s) and can be located above and/or around the source/drain regions 303 and 304.

The diagram of FIG. 3A illustrates the string 309 during an erase operation. In this example, the erase operation includes applying a relatively high potential difference between the control gates of the memory cells 311-1/311-2 and the substrate 302 in order to remove charge, e.g., electrons, from the floating gates of the cells 311-1/311-2. In this example, Verase is −20V, e.g., 20V is applied to the substrate body 302 and 0V is applied to the control gates of the cells 311-1/311-2. The high voltage erase pulse is intended to inject electrons from the floating gates of the memory cells into the substrate active area 302.

However, as shown in FIG. 3A, the biasing conditions applied to the string 309 during an erase operation can cause the electrons from the floating gate to become trapped electrons 335 in dielectric layers such as 337 located above the diffusion regions 303 and 304 between cell stacks 311-1/311-2 and between the edge cell stack 311-1 and the select gate 313. The trapping effect can be enhanced at the edges of a string of memory cells due to an increased lateral fringing field between the edge cell stack, e.g., 311-1, and a select gate, e.g., select gate 313. That is, the relatively high potential difference between the edge cell stack 311-1 and the select gate 313, during an erase operation, can result in more trapped electrons 335 in layer 337 between the edge cell stack 311-1 and select gate 313 than in layer 337 between adjacent cell stacks, e.g., between memory cell stacks 311-1 and 311-2. In the example shown in FIG. 3A, the control gate of edge memory cell 311-1 is biased at −20V with respect to the select gate 313, which is biased at about 0V, e.g., a ground voltage. As such, the lateral electric field between the edge cell stack 311-1 and the select gate 313 can cause electrons 335 to be emitted from the control gate (CG) and/or floating gate (FG) of edge cell 311-1 and become trapped in layer 337 above the diffusion region 304 between edge cell stack 311-1 and select gate 313.

In the embodiment illustrated in FIG. 3A, the arrows between edge cell 311-1 and select gate 313 represent the trajectory of electrons due to fringing field effects between a select gate and an edge cell stack during an erase operation. The arrows between edge cell stack 311-1 and select gate non-edge cell stack 311-2 represent the trajectory of electrons due to fringing field effects between adjacent cell stacks during an erase operation.

Through program/erase cycling, the trapped charge 335 can gradually accumulate between an edge cell stack, e.g., 311-1, and an adjacent select gate, e.g., select gate 313, and between adjacent memory cell stacks, e.g., 311-1/311-2. The accumulated trapped charge 335 can result in current degradation associated with a memory cell and/or a string of memory cells, e.g., string 309. That is, the build-up of charge 335 in the dielectric layer 337 between cells and/or between an edge cell and a select gate, can result in a gradual reduction of current associated with reading cells in the string. For instance, the trapped charge 335 can increase the resistance associated with the diffusion regions, e.g., 303 and 304, between cells.

As one of ordinary skill in the art will appreciate, in a read operation performed on a selected memory cell in a NAND string, the unselected memory cells of the string are biased so as to be in a conducting state. An example of operating voltages associated with a read operation is shown in FIG. 4. In such a read operation, the data stored in the selected cell can be based on the current and/or voltage sensed on the bit line corresponding to the string. For instance, data stored in the selected cell can be based on whether the bit line voltage changes by a particular amount or reaches a particular level in a given time period.

When the selected cell is in a conductive state, current flows between the source line contact at one end of the string and a bit line contact at the other end of the string. As such, the current associated with reading the selected cell is carried through each of the other cells in the string, the diffused regions between cell stacks, and the select transistors. Therefore, current reduction associated with each of the cells in the string, the diffused regions between cells, and/or the select gates, can cumulatively reduce the current associated with reading the selected cell. Memory cells affected by current degradation can become unreliable due to the reduced current associated with the selected cell of the string. For instance, the logical data value read from the cells may be different than the logical value written to the cells.

The cross-sectional diagram of FIG. 3B illustrates the string portion 309 during a healing operation according to an embodiment of the present disclosure. In various embodiments, a healing operation can be performed on a subset of non-volatile memory cells. The healing operation can be simultaneously performed on the subset of memory cells, in some embodiments. The subset of memory cells can include a string of memory cells, e.g., string 109-1 shown in FIG. 1, a block of memory cells, e.g., block 216-0 shown in FIG. 2, or another subset of memory cells associated with an array of non-volatile memory cells.

In the embodiment shown in FIG. 3B, the healing operation includes applying a healing voltage (Vheal) of 20V to the control gate (CG) of the edge memory cell 311-1 of the string 309, e.g., to the edge word line coupled to edge cell 311-1. In this embodiment, the healing voltage Vheal is also applied to each of the non-edge memory cells, e.g., 311-2, of the string 309, while the select gate 313 is biased at a lower voltage, e.g., 0V in this example. The potential difference between the edge cell 311-1 and select gate 313 creates a lateral electric field opposite in direction to the lateral field between the edge cell 311-1 and the select gate 313 during the erase operation, e.g., the erase operation shown in FIG. 3A. Although only a first end of the string 309 is shown in FIG. 3B, the healing voltage Vheal can also be applied to the edge memory cell at the opposite end of the string 309 and the select gate at the opposite end of the string 309 can be biased at a lower voltage, e.g., 0V. In various embodiments, during a healing operation, the bit line (not shown) corresponding to the string 309, the source line (not shown) coupled to the string 309, and the substrate body 302 associated with the string 309 can be biased at a ground voltage, e.g., 0V.

The application of the healing voltage Vheal to the memory cells of string 309, in combination with the other biasing conditions discussed in the example of FIG. 3B above, can be used to extract charge 335 accumulated between the select gates at the ends of the string and respective edge memory cell stacks, e.g., edge cell stack 311-1. As discussed above, the charge 335 can be trapped electrons 335 located in dielectric layer 337 formed above the diffusion regions 303 and 304. As such, various healing operation embodiments can be used to extract the trapped electrons 335 between an edge cell and a select gate or between adjacent memory cell stacks to a floating gate (FG) and/or control gate (CG) of the memory cells. That is, the healing operation can be used to recover electrons 335 which may have accumulated due to various factors such as program/erase cycling, for example.

Performing one or more healing operations in accordance with embodiments of the present disclosure can reduce and/or prevent the likelihood of a data read failure associated with reading non-volatile memory cells. For example, recovering stranded electrons, e.g., 335, from a dielectric layer, e.g., 337, between a select gate, e.g., 313, and an edge memory cell stack, e.g., 311-1, of a string, e.g., 309, reduces the amount of accumulated charge, e.g., 335, built up through program/erase cycling, which reduces the current degradation associated therewith. Reducing current degradation can have various benefits such as increasing the accuracy associated with reading memory cells and/or prolonging the useful life of a block of memory cells, among other benefits. For instance, performing one or more healing operations on a string or block of memory cells may prevent a controller from retiring a block of memory cells, e.g., from no longer using a block due to excessive erase verify failures or data read failures, for example.

Embodiments of the present disclosure are not limited to the example shown in FIG. 3B. For instance, as discussed further in connection with FIGS. 4 and 5 below, in various embodiments, different healing voltages can be applied to the edge word lines and to the non-edge word lines. In such embodiments, the same healing voltage may or may not be applied to both select gate transistors. In various embodiments, a first healing voltage can be applied to the edge word lines, while a different voltage is applied to each of the non-edge word lines. In some embodiments, a different healing voltage may be applied to a number of different non-edge word lines. In various embodiments, the healing voltages are applied as one or more healing voltage pulses. In various embodiments, the healing voltages can be simultaneously applied to each of the memory cells in a string. In some embodiments, the healing voltages can be simultaneously applied to each word line associated with a block of memory cells such that each string associated with the block simultaneously experiences the healing operation.

FIG. 4 illustrates a table 410 of operating voltages that can be used in accordance with embodiments of the present disclosure. The table 410 illustrates voltages applied to a bit line (BL), a drain select line (SOD), a number of word lines (WL-0 through WL-31), a source select line (SGS), a common source line (SOURCE), and a substrate body (P-well) associated with a string 409 of non-volatile memory cells coupled in series between a select gate source transistor and a select gate drain transistor. The table 410 illustrates examples of voltages applied to the string 409 during a heal operation 439 (HEAL), an erase operation (ERASE), and an erase verify operation (ERASE VERIFY) performed on the string 409. The table 410 also illustrates operating voltages for a program operation (PROGRAM) and a read operation (READ) associated with programming and reading a memory cell of the string 409, e.g., a cell coupled to WL-1 in this example.

In various healing operation embodiments, a first select gate transistor, e.g., a select gate source transistor, coupled to a string of memory cells is biased at a first voltage while a second select gate transistor, e.g., a select gate drain transistor, coupled to the string is biased at a second voltage. In some embodiments, and as shown in FIG. 4, the first and the second voltages applied to the first and second select gate transistors can be the same voltage, e.g., 0V in this example. In various embodiments, the select gate transistors are biased at a voltage of between 0V and 2V. In some embodiments, the select gate transistors are biased at a voltage not greater than 1V. Maintaining the select gate transistors at a low voltage relative to the edge word lines, e.g., WL-0 and WL-31, can provide a sufficient potential difference such that trapped charge, e.g., 335 shown in FIGS. 3A and 3B, can be extracted from a dielectric layer, e.g., 337 shown in FIGS. 3A and 3B, between the edge word lines and the select gates to the floating gates and/or control gates of the edge memory cells of the string, e.g., 409.

In various healing operation embodiments, a first healing voltage is applied to a first edge word line, e.g., WL-0, in order to extract charge accumulated between the first select gate transistor, e.g., the select gate source transistor, and a first edge memory cell stack of the string, e.g., a cell coupled to WL-0, and a second healing voltage is applied to a second edge word line, e.g., WL-31, in order to extract charge accumulated between the second select gate transistor, e.g., the select gate drain transistor, and a second edge memory cell stack of the string, e.g., a cell coupled to WL-31. In various embodiments, the healing voltage applied to the first and second edge word lines, e.g., WL-0 and WL-31 in this example, can be the same voltage. In some embodiments, the healing voltage applied to the first and second edge word lines has a magnitude of at least 15V. In some embodiments, the healing voltage has a magnitude of between 15V and 25V. Embodiments are not so limited.

For example, in some embodiments, the healing voltage applied to the edge word lines can be less than 15V and still have a sufficient magnitude to create a sufficient lateral electric field between the edge memory cell stack and the select gate to extract charge accumulated from therebetween to the floating gate and/or control gate of the edge cell stack. As noted above, the accumulated charge can be electrons trapped in a dielectric layer formed above a diffusion layer, e.g., 304 shown in FIGS. 3A and 3B, formed in the substrate between the edge cell stack and the select gate.

In various embodiments, and as shown in FIG. 4, a healing operation, e.g., 439, can include applying a healing voltage Vheal to a number of the non-edge word lines, e.g., WL-1 through WL-30 in this example. In some embodiments, the healing voltage applied to the non-edge word lines has a magnitude of at least 15V. The healing voltage applied to the number of non-edge word lines may or may not be the same healing voltage that is applied to the edge word lines. In some embodiments, a healing voltage is applied to each of the non-edge word lines. In various embodiments, and as described further in connection with FIG. 5, the healing voltage applied to the non-edge word lines is lower in magnitude than the healing voltage applied to the edge word lines.

In various embodiments, the voltage difference between healing voltages applied to adjacent word lines is not more than 5V. Maintaining a relatively small voltage difference between adjacent word lines can avoid production of a relatively large lateral electric field between adjacent word lines during a healing operation. Applying a higher magnitude voltage to the edge word lines than that applied to the non-edge word-lines can facilitate extraction of charge accumulated in the dielectric layer between the edge cell stack and the select gate. In various embodiments in which a lower magnitude healing voltage is applied to non-edge word lines, the healing voltage applied to the non-edge word lines can have a magnitude sufficient to extract charge accumulated between adjacent memory cells stacks of the string.

In various embodiments, and as shown in table 410, a healing operation, e.g., HEAL 439, can include biasing the bit line (BL), the source line (SOURCE), and the substrate body (P-well) associated with the string of cells, e.g., string 409, at a ground voltage, e.g., 0V. Embodiments are not limited to the example voltages illustrated in table 410. For instance, in various embodiments, the bit line, source line, and substrate body associated with a string, e.g., 409, can each be biased at different voltages. In various embodiments, biasing at least the substrate body, the select gate source line (SGS), and the select gate drain line (SOD) at a low voltage with respect to the healing voltage (Vheal) can facilitate extraction of trapped charge from between adjacent cells and from between an edge cells and respective select gates.

As discussed above in connection with FIG. 3B, a healing operation results in the accumulation of charge, e.g., electrons, on cell floating gates. In some embodiments, a healing operation places some or all of the memory cells of a string into an overprogrammed condition. The accumulation of charge on the floating gates is similar to that experienced by the cells during a programming operation, e.g., PROGRAM shown in FIG. 4. After non-volatile memory cells have been programmed, the cells are erased, e.g., electrons accumulated on the floating gates are injected into the substrate such that the cells can be reprogrammed to desired data states. Similarly, memory cells on which a healing operation has been performed can be erased prior to experiencing further programming operations. As such, in some embodiments, a healing operation is performed on a string or block of cells based on when the string or block is to be erased. For instance, in various embodiments of the present disclosure, operation of an array of non-volatile memory cells can include performing a healing operation, e.g., 439, on a string 409 prior to each erase operation.

In various embodiments of the present disclosure, a healing operation can be performed on a string or block of memory cells based on the number of program/erase cycles, e.g., a hot count, experienced by the particular string or block of cells. The healing operation can be performed at predetermined intervals, e.g., after each 1,000 program/erase cycles. In some embodiments, a healing operation is performed on a subset of cells, e.g., a string or block, in response to a threshold number of erase operations, e.g., 500 or 5,000, having been performed on the block.

In some embodiments, a healing operation can be performed in response to an erase verify failure associated with a string of cells. An example of an erase verify operation is shown in table 410 of FIG. 4. An erase verify failure can result if any of the cells in the string is determined to be in a state other than the erase state, e.g., if any of the cells is determined to have a threshold voltage level greater than 0V in this example. An erase verify failure can be a result of current degradation due to charge accumulated in the dielectric layer(s) above diffusion regions between an edge cell stacks and select gates and between adjacent cell stacks, as discussed above. As such, an erase verify failure can be used as an indicator of increased current degradation associated with a subset of cells, e.g., a string or block of cells. To counteract the increased current degradation, a healing operation in accordance with embodiments of the present disclosure can be performed on a string of cells in response to an erase verify failure associated with the string, or with the block corresponding to the string.

FIG. 5 illustrates another table 510 of operating voltages that can be used in accordance with embodiments of the present disclosure. The table 510 illustrates voltages applied to a bit line (BL), a drain select line (SGD), a number of word lines (WL-0 through WL-31), a source select line (SGS), a common source line (SOURCE), and a substrate body (P-well) associated with a string 509 of non-volatile memory cells coupled in series between a select gate source transistor and a select gate drain transistor. The table 510 illustrates examples of voltages applied to the string 509 during a healing operation 539-1 (HEAL-1), during a healing operation 539-2 (HEAL-2), and during a healing operation 539-3 (HEAL-3).

As shown in FIG. 5, the healing operations 539-1, 539-2, and 539-3 include a higher magnitude voltage, e.g., 20V in this example, applied to the edge word lines, e.g., WL-0 and WL-31, than the healing voltages applied to the non-edge word lines, e.g., WL-1 through WL-30. Applying a higher magnitude voltage to the edge word lines than that applied to the non-edge word-lines can facilitate extraction of charge accumulated in the dielectric layer between the edge cell stack and the select gate. In various embodiments, the voltage difference between healing voltages applied to the edge word lines and adjacent non-edge word lines is not more than 5V. Maintaining a relatively small voltage difference between adjacent word lines can avoid production of a relatively large lateral electric field between the edge word lines and the non-edge word lines adjacent thereto during a healing operation.

In some embodiments, such as the healing operation 539-1, the same healing voltage, e.g., 20V, is applied to each of the word lines associated with a string, e.g., string 509. In some embodiments, such as the healing operation 539-2, a first healing voltage, e.g., 20V, is applied to edge word lines, while a second healing voltage, e.g., 15V, is applied to each of the non-edge word lines associated with a string, e.g., string 509. In such embodiments, applying a higher voltage to edge word lines than to non-edge word lines may facilitate extraction of electrons trapped between an edge cell and a select gate. Applying the same voltage to each of the non-edge word lines can provide benefits such as a reduced lateral electric field associated with adjacent word lines.

In some embodiments, such as the healing operation 539-3, a different healing voltage is applied to a number of the non-edge word lines associated with string 509. In some such embodiments, the voltages applied to the number of non-edge word lines are applied such that the voltage difference between adjacent non-edge word lines is not more than 5 volts. Maintaining a relatively small voltage difference between adjacent non-edge word lines can avoid production of a relatively large lateral electric field between the adjacent word lines during a healing operation. In some embodiments, a different healing voltage can be applied to each of the non-edge word lines.

In the embodiment shown in FIG. 5, the healing operation 539-3 includes a stepped down healing voltage applied to the word lines from an uppermost healing voltage, e.g., 20V in this example, applied to the edge word lines to a lowermost healing voltage applied to word lines furthest from the edge word lines, e.g., word lines closest to the center of the string. In the healing operation 539-3, the applied healing voltage is stepped down in 2V steps from the edge word lines of the string toward the center of the string. That is, in this example, the potential difference between the healing voltage applied to each adjacent word line is 2V. However, embodiments are not limited to this example. For instance, the step size, e.g., potential difference, between healing voltages applied to adjacent word lines can be 0.5V, 1V, 5V, etc.

Also, the step size between adjacent word lines may not be uniform. For instance, in various embodiments, the step size between healing voltages applied to adjacent word lines can vary, e.g., the step size can be different for word lines closer to the edges of the string than for word lines closer to the center of the string.

Embodiments are not limited to the example voltages illustrated in table 510. For instance, in various embodiments, the bit line, source line, and substrate body associated with a string, e.g., 509, can each be biased at different voltages. In various embodiments, biasing the substrate body (P-well), the select gate source line (SGS), the select gate drain line (SGD), the common source line (SOURCE), and the bit line associated with a string, e.g., 509, of non-volatile memory cells, at a ground voltage with respect to the healing voltages, can facilitate extraction of trapped charge from between adjacent cells and from between edge cells and respective select gates.

Memory system 600 includes a processor 610 coupled to a non-volatile memory device 620 that includes a memory array 630 of non-volatile cells, e.g., a memory array such as array 100 shown in FIG. 1 or array 230 shown in FIG. 2. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

For clarity, the electronic memory system 600 has been simplified to focus on features with particular relevance to the present disclosure. The memory device 620 includes an array of non-volatile memory cells 630, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

Figure 6:
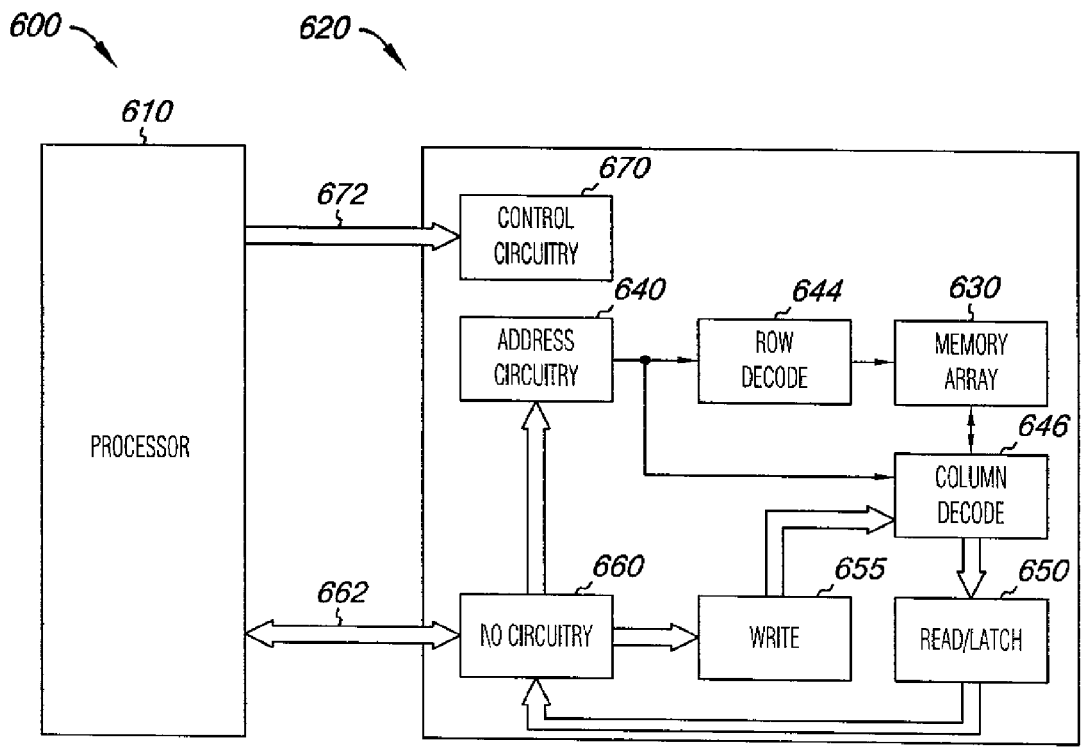
FIG. 6 is a functional block diagram of an electronic memory system having at least one memory device in accordance with an embodiment of the present disclosure.

The embodiment of FIG. 6 includes address circuitry 640 to latch address signals provided over I/O connections 662 through I/O circuitry 660. Address signals are received and decoded by a row decoder 644 and a column decoder 646 to access the memory array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The memory array 630 includes non-volatile memory cells that can be healed according to embodiments described herein. The memory device 620 reads data in the memory array 630 by sensing voltage and/or current changes in the memory array columns using sense/buffer circuitry that in this embodiment can be read/latch circuitry 650. The read/latch circuitry 650 can be coupled to read and latch a row of data from the memory array 630. I/O circuitry 660 is included for bi-directional data communication over the I/O connections 662 with the processor 610. Write circuitry 655 is included to write data to the memory array 630.

Control circuitry 670 decodes signals provided by control connections 672 from the processor 610. These signals can include chip signals, write enable signals, and address latch signals that are used to control the operations on the memory array 630, including read, write, heal, and erase operations. In various embodiments, the control circuitry 670 is responsible for executing instructions from the processor 610 to perform the operating and programming embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
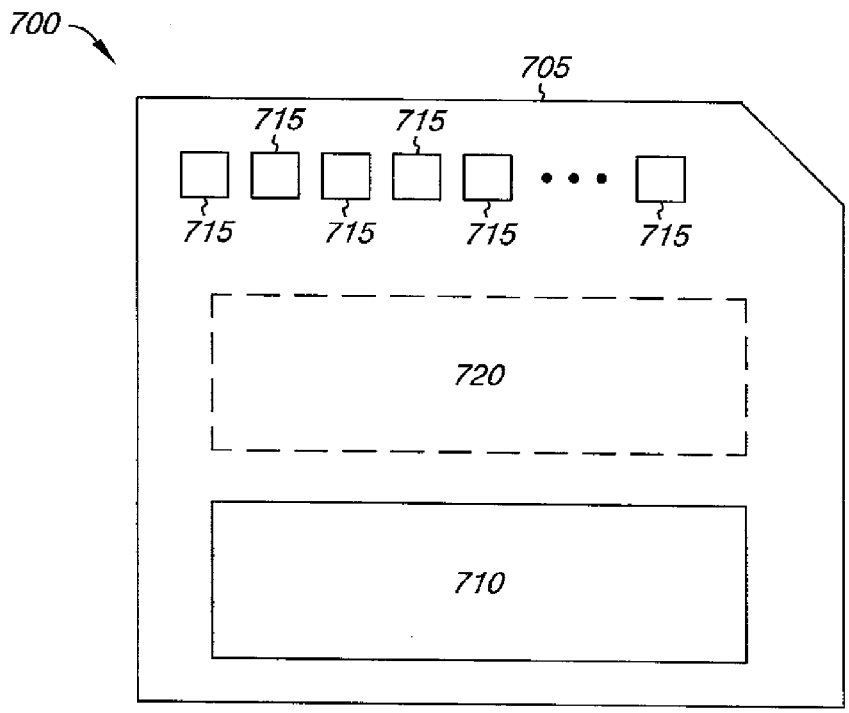
FIG. 7 is a functional block diagram of a memory module having at least one memory device in accordance with an embodiment of the present disclosure.

Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 includes an array of non-volatile memory cells healed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Methods, devices, modules, and systems for healing non-volatile memory cells have been shown. One method includes biasing a first select gate transistor coupled to a string of memory cells at a first voltage, biasing a second select gate transistor coupled to the string at a second voltage, applying a first healing voltage to a first edge word line in order to extract charge accumulated between the first select gate transistor and a first edge memory cell stack of the string, and applying a second healing voltage to a second edge word line in order to extract charge accumulated between the second select gate transistor and a second edge memory cell stack of the string.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A device comprising:
   an array of memory cells including a number of subsets of cells coupled in series between a select gate source transistor and a select gate drain transistor; and
   control circuitry coupled to the array and configured to perform a healing operation on a number of the memory cells by:
   applying a first healing voltage to a first edge memory cell of a first subset of cells;
   applying a second healing voltage to a second edge memory cell of the first subset of cells; and
   applying at least a third healing voltage to a number of non-edge memory cells of the first subset; and
   wherein the healing operation is performed based on a quantity of program/erase cycles experienced by the number of memory cells reaching a number of different threshold quantities.

2. The device of claim 1, wherein the control circuitry is configures to perform an erase operation on the number of memory cells subsequent to performing the healing operation and prior to performing a subsequent programming operation on the number of memory cells.

3. The device of claim 1, wherein the number of subsets of cells are strings of NAND memory cells.

4. The device of claim 1, wherein the control circuitry is configured to simultaneously perform the healing operation on the number of subsets of cells.

5. The device of claim 1, wherein the first, second, and third healing voltages are applied simultaneously.

6. The device of claim 1, wherein the first, second, and third healing voltages have the same magnitude.

7. The device of claim 1, wherein a magnitude of the first and second healing voltage is greater than a magnitude of the at least a third healing voltage.

8. The device of claim 7, wherein the magnitude of the first and second healing voltage is at least 15 volts.

9. The device of claim 8, wherein applying the at least a third healing voltage to the number of non-edge memory cells includes applying healing voltages higher in magnitude to those non-edge memory cells located closer to the first and second edge memory cells than to those non-edge memory cells located further from the first and second edge memory cells.

10. A method, comprising:
performing a quantity of program/erase cycles on a number of memory cells coupled in series between a first and a second select gate transistor;
subsequently performing a healing operation on the number of cells based on the quantity of program/erase cycles reaching a first threshold quantity, the healing operation including:
applying a healing voltage to a first edge memory cell;
applying a healing voltage to a second edge memory cell; and
applying a healing voltage to the non-edge memory cells;
performing an erase operation on the number of cells subsequent to the healing operation and prior to performing an additional program/erase cycle on the number of cells; and
performing a subsequent healing operation on the number of cells based on the quantity of program/erase cycles reaching a second threshold quantity, wherein the second threshold quantity is different than the first threshold quantity.

11. The method of claim 10, wherein the healing voltage applied to the first edge memory cell and to the second edge memory cell is a different voltage than the healing voltage applied to the non-edge memory cells.

12. The method of claim 11, wherein applying the healing voltage to the non-edge memory cells includes applying a healing voltage higher in magnitude to those non-edge cells located closer to the first and second edge cells than to those non-edge cells located further from the first and second edge cells.

13. The method of claim 10, wherein:
applying the healing voltage to the first edge memory cell includes extracting charge from between the first select gate transistor and the first edge memory cell to a charge storage node of the first edge memory cell; and
applying a healing voltage to a second edge memory cell of the number of cells includes extracting charge from between the second select gate transistor and the second edge memory cell to a charge storage node of the second edge memory cell.

14. The method of claim 10, wherein the method includes performing the healing operation based on a wear leveling algorithm.

15. A method, comprising:
performing a number of program and erase operations on a number of memory cells coupled in series between a first and a second select gate transistor;
subsequently performing a healing operation on the number of cells in response to a reaching of a first threshold hot count, the healing operation including:
applying a healing voltage to a first edge memory cell of the number of cells;
applying a healing voltage to a second edge memory cell of the number of cells; and
applying a healing voltage to the non-edge memory cells of the number of cells;
wherein the healing voltage applied to at least one of the first edge memory cell, the second edge memory cell, and at least one non-edge memory cell increases a threshold voltage level of the memory cell to a level at or above an erase verify voltage level; and
performing a subsequent healing operation on the number of memory cells in response to a reaching of a second threshold hot count, wherein the second threshold hot count is different than the first threshold hot count.

16. The method of claim 15, wherein the method further comprises performing an erase operation on the number of cells subsequent to the healing operation and prior to performing an additional programming operation on the number of cells.

17. The method of claim 15, wherein the healing voltage applied the first edge memory cell, the second edge memory cell, and the non-edge memory cells has a magnitude of at least 15 volts.

18. The method of claim 15, wherein the method includes performing the first healing operation in response to the threshold hot count reaching a value of at least 500.

19. The method of claim 18, wherein the method includes performing a number of subsequent healing operations in response to the threshold hot count reaching a number of thresholds.

20. A device comprising:
an array of memory cells including a number of subsets of cells coupled in series between a select gate source transistor and a select gate drain transistor; and
control circuitry coupled to the array and configured to perform a healing operation on a number of the memory cells by:
applying a first healing voltage to a first edge memory cell of a first subset of cells;
applying a second healing voltage to a second edge memory cell of the first subset of cells; and
applying at least a third healing voltage to a number of non-edge memory cells of the first subset; and
wherein the healing operation is performed based on a quantity of program/erase cycles experienced by the number of memory cells; and
wherein applying the at least a third healing voltage to the number of non-edge memory cells includes applying healing voltages higher in magnitude to those non-edge memory cells located closer to the first and second edge memory cells than to those non-edge memory cells located further from the first and second edge memory cells.

21. A method, comprising:
performing a quantity of program/erase cycles on a number of memory cells coupled in series between a first and a second select gate transistor;

subsequently performing a healing operation on the number of cells based on the quantity of program/erase cycles, the healing operation including:
applying a healing voltage to a first edge memory cell;
applying a healing voltage to a second edge memory cell; and
applying a healing voltage to the non-edge memory cells; and
performing an erase operation on the number of cells subsequent to the healing operation and prior to performing an additional program/erase cycle on the number of cells;
wherein applying the healing voltage to the non-edge memory cells includes applying a healing voltage higher in magnitude to those non-edge memory cells located closer to the first and second edge memory cells than to those non-edge memory cells located further from the first and second edge memory cells.

* * * * *

UNITED STATES PATENT AND TRADEMARK OFFICE
CERTIFICATE OF CORRECTION

PATENT NO. : 8,542,542 B2
APPLICATION NO. : 13/567729
DATED : September 24, 2013
INVENTOR(S) : Mihnea et al.

Page 1 of 1

It is certified that error appears in the above-identified patent and that said Letters Patent is hereby corrected as shown below:

In the Claims

Column 14, line 62, in Claim 2, delete "configures" and insert -- configured --, therefor.

Column 16, line 30, in Claim 17, delete "applied" and insert -- applied to --, therefor.

Signed and Sealed this
Twenty-sixth Day of November, 2013

Margaret A. Focarino
*Commissioner for Patents of the United States Patent and Trademark Office*